(12) United States Patent
Davidson et al.

(10) Patent No.: US 6,268,238 B1
(45) Date of Patent: Jul. 31, 2001

(54) THREE DIMENSIONAL PACKAGE AND ARCHITECTURE FOR HIGH PERFORMANCE COMPUTER

(75) Inventors: Evan Ezra Davidson, Hopewell Junction; David Andrew Lewis, Carmel, both of NY (US); Jane Margaret Shaw, Ridgefield, CT (US); Alfred Viehbeck, Fishkill; Janusz Stanislaw Wilczynski, Ossining, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/111,507

(22) Filed: Jul. 8, 1998

Related U.S. Application Data

(62) Division of application No. 08/699,954, filed on Aug. 20, 1996, now Pat. No. 5,817,986, which is a division of application No. 08/554,009, filed on Nov. 6, 1995, now Pat. No. 5,935,887, which is a division of application No. 08/054,110, filed on Apr. 27, 1993, now Pat. No. 5,495,397.

(51) Int. Cl.⁷ ........................... H01L 21/44; H01L 21/48; H01L 21/50
(52) U.S. Cl. ................... 438/107; 438/108; 438/110; 438/121
(58) Field of Search .................. 438/107, 106, 438/108, 125, 121, 110

(56) References Cited

U.S. PATENT DOCUMENTS

| | | | |
|---|---|---|---|
| 5,095,627 | * | 3/1992 | Bujagec et al. . |
| 5,377,077 | * | 12/1994 | Burns . |
| 5,385,855 | * | 1/1995 | Brown et al. . |
| 5,789,815 | * | 8/1998 | Tessier et al. . |

* cited by examiner

Primary Examiner—Kevin M. Picardat
Assistant Examiner—D. M. Collins
(74) Attorney, Agent, or Firm—Daniel P. Morris

(57) ABSTRACT

A three dimensional packaging architecture for ultimate high performance computers and methods for fabricating thereof are described. The packgage allows very dense packaging of multiple integrated circuit chips for minimum communication distances and maximum clock speeds of the computer. The packaging structure is formed from a plurality of subassemblies. Each subassembly is formed from a substrate which has on at least one side thereof at least one integrated circuit device. Between adjacent subassemblies there is disposed a second substrate. There are electrical interconnection means to electrically interconnect contact locations on the subassembly to contact locations on the second substrate. The electrical interconnection means can be solder mounds, wire bonds and the like. The first substrate provides electrical signal intercommunication between the electronic devices and each subassembly. The second substrate provides ground and power distribution to the plurality of subassemblies. Optionally, the outer surfaces of the structure that can be disposed a cube of memory chips.

19 Claims, 7 Drawing Sheets

FIG. 3.1
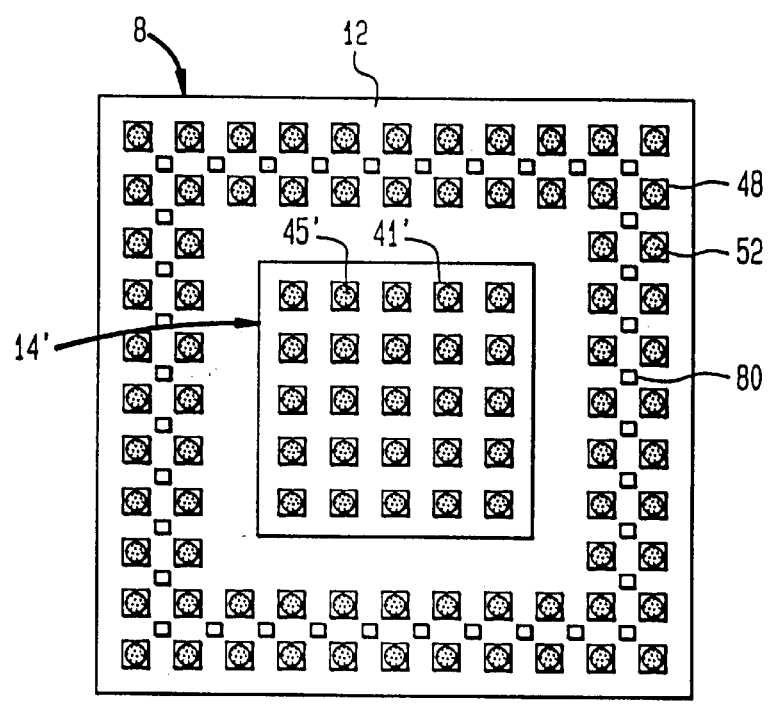
FIG. 3.2
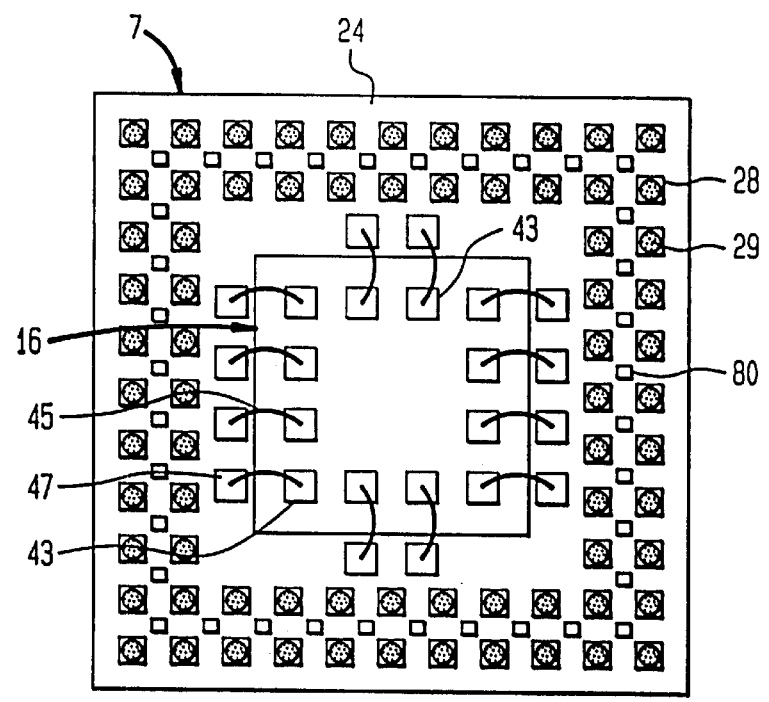

THREE DIMENSIONAL PACKAGE AND ARCHITECTURE FOR HIGH PERFORMANCE COMPUTER

This application is a Division of Ser. No. 08/699,954 filed Aug. 20, 1996 now U.S. Pat. No. 5,817,986 which is a Division of Ser. No. 08/554,009 filed Nov. 6, 1995 now U.S. Pat. No. 5,935,887 which is a Division of Ser. No. 08/054,110 filed Apr. 27, 1993 now U.S. Pat. No. 5,495,397.

FIELD OF THE INVENTION

The present invention relates to a package and architecture which allows very dense packaging of multiple integrated circuit chips for minimum communication distances and maximum clock speeds.

BACKGROUND OF THE INVENTION

To reduce the cost and increase the performance or electronic computers, it is desirable to place as many electronic circuits in as small a region as possible in order to reduce the distance over which electrical signals must travel from one circuit to another. This can be achieved by fabricating, on a given area of a semiconductor chip, as many electronic circuits as feasible within a given fabrication technology. These dense chips are generally disposed on the surface of a substrate in a side by side arrangement with space left therebetween to provide regions for electrical conductors for electrical interconnection of the chips. The chip contact locations can be electrically interconnected to substrate contact locations by means of wires bonded in between the chip contact location and substrate contact locations. Alternatively, a TAB tape (which is a flexible dielectric layer having a plurality of conductors disposed thereon) can be used for this electrical interconnection. Alternatively, the semiconductor chips may be mounted in a flip-chip configuration wherein an array of contact locations on the semiconductor chip is aligned with and electrically interconnected to an array of contact locations on a substrate by means of solder mounds disposed between corresponding chips and substrate contact locations. This side by side arrangement of electronic devices is not the most dense configuration which can be achieved.

In the microelectronics industry, integrated circuits, such as semiconductor chips, are mounted onto packaging substrates to form modules. In high performance computer applications, the modules contain a plurality of integrated circuits. A plurality of modules are mounted onto a second level of packages such as a printed circuit board or card. The cards are inserted into a frame to form a computer.

For nearly all conventional interconnection package, except for double sided cards, signals from one chip on the package travel in a two dimensional wiring net to the edge of the package, then travel across the card or board or even travel along cables before they reach the next package which contain the destination integrated circuit chip. Therefore, signals must travel off of one module onto wiring on a board or onto wiring on a cable to a second module and from a second module to the destination integrated circuit chip in the second module. This results in a long package time delay and increases the demands on wireability of the two dimensional wiring arrays.

As the performance requirements of a mainframe computer continue to increase, the signal propagation time for communications from module to module, chip to chip and even device to device become critical. The current solution to this problem is to place the chips as close together as possible on a planar substrate and combine as many circuits as possible onto the substrate using insulators having dielectric constants as low as possible between wiring layers.

However, it is becoming apparent that such solutions will not allow future generation machines to reach the desired performance levels. One of the most significant factors is the time required for a signal to cross the length of a module. Three dimensional packaging structures will overcome the problem of the signal progagation distances in the planar packages, but the difficulty has been finding a suitable way to interconnect the devices in such a structure.

An improvement in chip interconnection propagation time and an increase in real chip packaging density can be achieved if three dimensional wiring between closely spaced planes of chips can be achieved.

SUMMARY OF THE INVENTION

It is an object of the present invention to provide an improved packaging structure wherein the integrated circuit devices are packaged in a three dimensional structure.

It is another object of the present invention to provide such an improved packaging structure with both horizontal electrical interconnections and vertical electrical interconnections.

It is a further object of the present invention to provide an improved packaging structure which is composed of a plurality of subassemblies each of which are separately testable and electrically interconnected by vertical electrical interconnections.

It is yet another object of the present invention to provide an improved packaging structure for providing electrical interconnection to high I/O count chips and providing a means for dissipating heat generated in the chips.

A broad aspect of the present invention is an integrated circuit packaging structure formed from a plurality of subassemblies. Each subassembly has a first substrate having a first side and a second side. There is at least one electronic device disposed on the first side and on the second side. There are a plurality of second substrates. The subassemblies are disposed between the second substrates. The subassemblies are in electrical communication with the second substrates.

In a more particular aspect of the present invention, the first substrates have electrical conductors for providing electrical interconnection between the first and second sides of the first substrate.

In another more particular aspect of the present invention, the electrical conductors of the first substrate predominately provide signal I/O to the electronic devices.

In another more particular aspect of the present invention, the second substrates predominately provide power distribution to the subassemblies.

In another more particular aspect of the present invention, the first substrates have a plurality of contact locations and the second substrates have a plurality of contact locations. Each of the first plurality of contact locations is disposed adjacent one of the second plurality of contact locations. There is an electrical interconnection means between the adjacent contact locations for providing electrical communication between the first substrates and second substrates.

In another more particular aspect of the present invention, each of the second substrates has an end which is disposed in electrical communication with a third substrate.

In another more particular aspect of the present invention, the first plurality of electronic devices and the second plurality of electronic devices are logic devices.

In another more particular aspect of the present invention, a stack of integrated circuit memory devices are disposed in contact with at least one of the second substrates.

BRIEF DESCRIPTION OF THE DRAWINGS

These and other objects, features and advantages of the present invention will become apparent upon consideration of the following detailed description of the invention when read in conjunction with the drawing figures in which:

FIG. 3.1 is a top view of a subassembly of the structure of FIGS. 1 and 2 wherein solder mound bonding is used.

FIG. 3.2 is a top view of another subassembly of the structure of FIGS. 1 and 2 wherein wire bonding is used.

DETAILED DESCRIPTION

Figure 1:
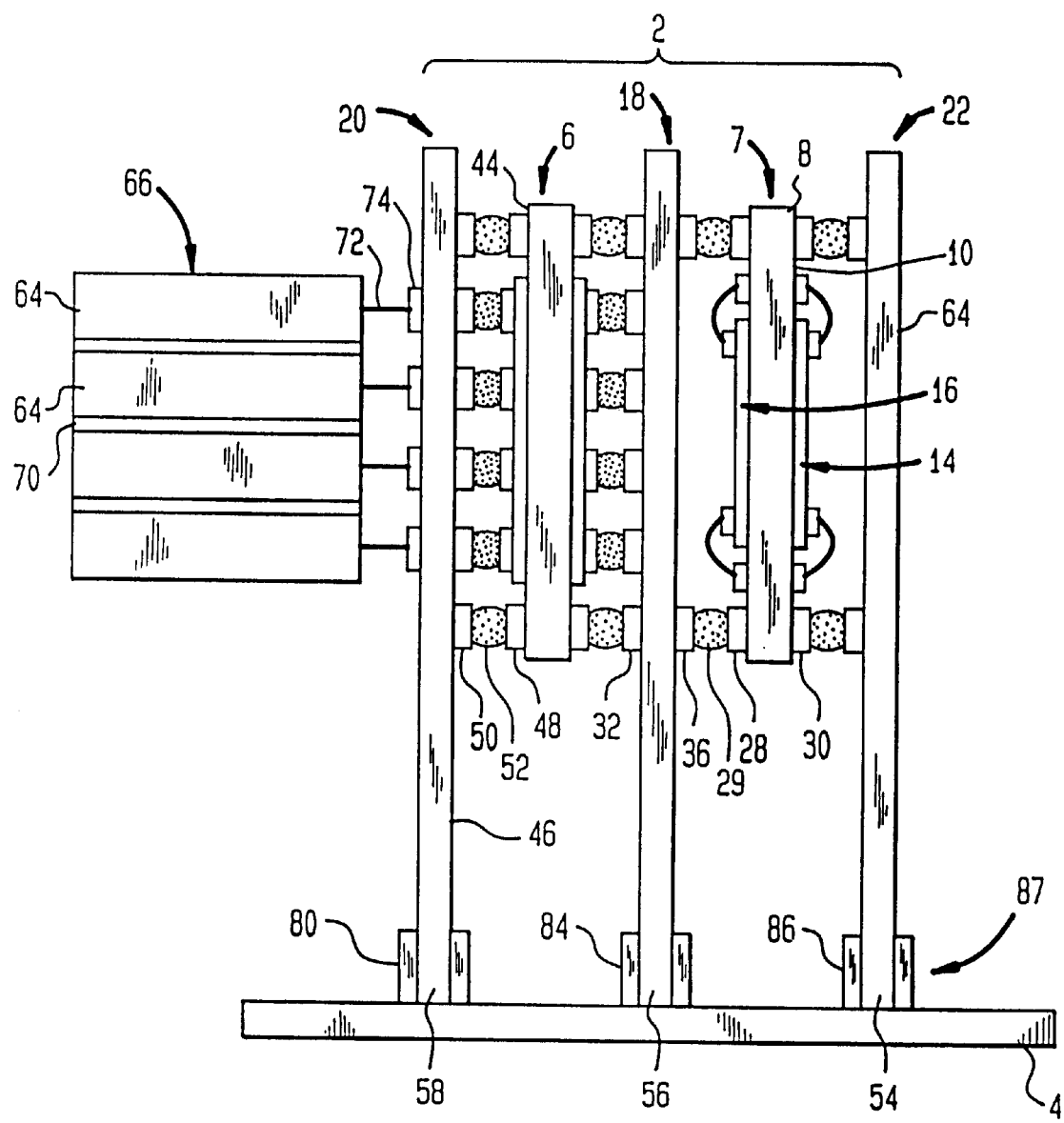
FIG. 1 is a side view of the structure according to the present invention.
Figure 2:
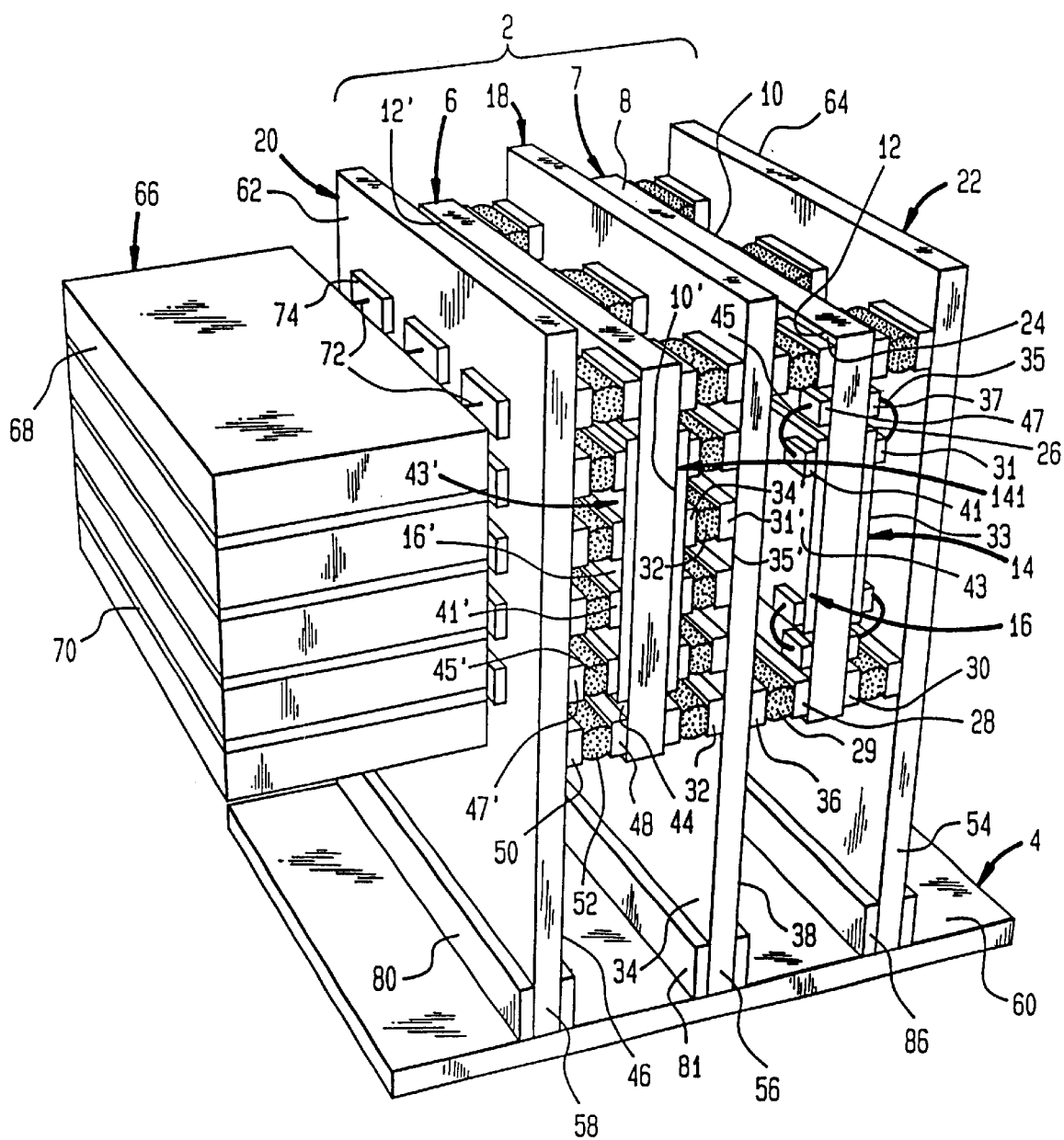
FIG. 2 is a perspective view of the structure of FIG. 1.

Referring to FIG. 1, there is shown a side view of the structure of the present invention. FIG. 2 shows a perspective view of the structure shown in FIG. 1. FIGS. 1 and 2 show a module 2 which is mounted onto an electronic substrate 4, such as a printed circuit board. Module 2 comprises at least one subassembly 6 or 7. The subassembly 6 comprises a substrate 8 such as a printed circuit board, a circuitized ceramic packaging substrate, a circuitized glass ceramic packaging substrate, a circuitized polymeric packaging substrate, a circuitized metal packaging substrate, a circuitized glass packaging substrate a circuitized semiconductor substrate and the like. Substrate 8 has a first side 10 and a second side 12 on each of which there is preferably disposed an electronic device 14 and 16 respectively. The electronic devices 14 and 16 are typically an integrated circuit chip. There can be a plurality of devices 14 and 16 on sides 10 and 12, respectively. Between the subassemblies 6 there is disposed a second substrate 18. Substrate 18 can be a circuitized ceramic, glass ceramic, glass, polymer, metal or semiconductor substrate or a printed circuit board or a combination thereof. On both ends of the structure of FIG. 2 there are substrates 20 and 22. Substrates 20 and 22 are similar to substrate 18. Each substrate 8 has a first side 24 and a second side 26. On side 24 there are a plurality of electrical contact pads 28 and on side 26 there are a plurality of electrical contact pads 30. On substrate 18, which is disposed between subassemblies 6 and 7, there are contact pads 32 on side 34 of substrate 18 and contact pads 36 on side 38 of substrate 18. Contact pads 36 are aligned with contact pads 28 on subassembly 7. Between contact pads 36 and 28 there is disposed an electrical interconnection means 29 which is preferably a solder mound which is soldered to pads 36 and 28. On surface 40 of substrate 20 there are a plurality of contact pads 50. Surface 46 faces surface 44 of subassembly 6. On surface 44 there are pads 48 which are aligned with and adjacent to pads 50 on surface 46 of substrate 20. Between pads 48 and 50 there is disposed electrical interconnection means 52 which is preferably a solder mound soldered between pads 48 and 50. Ends 54, 56 and 58 of substrates 22, 18 and 20, respectively, are disposed adjacent surface 60 of substrate 4. Electrical conductors in substrates 18, 20 and 22 extend to ends 56, 58 and 54, respectively, to provide electrical interconnection to electrical conductors in substrate 4. The electrical interconnection means 87 electrically connecting ends 54, 56 and 58 to substrate 4 can be a commonly used plug and socket or electrically conducting pads on ends 54, 56 and 58 can be solder bonded to a corresponding set of pads on surface 60 of substrate 4 (as described in U.S. patent application Ser. No. 07/760,038, Sep. 3, 1991, the teaching of which is incorporated herein by reference) or any commonly used electrical interconnection means of one substrate to another can be used. Optionally, on one of the outer surfaces 62 or 64 of the combination structure 2 of FIG. 2 there can be disposed an integrated circuit device. In FIG. 2 there is shown a stack 66 of integrated circuit devices 68 which have an adhesive material 70 disposed between adjacent integrated circuit devices 68 in the stack to hold it together. U.S. patent application Ser. No. 07/760,038, filed Sep. 13, 1991, assigned to the assignee of the present invention, the teaching of which is incorporated herein by reference and U.S. patent application Ser. No. 07/903,838, filed Jun. 24, 1992, assigned to the assignee of the present invention, the teaching of which is incorporated herein by reference, teach stacked chip structures which are useful to practice the present invention. In the preferred embodiment from stack 66 there extends a plurality of electrically conducting wires 72 which are electrically interconnected to pads 74 on surface 62 of substrate 20. Electronic devices 16 and 14 are preferably logic integrated circuit devices and chip stack 66 is preferably a stack of integrated circuit memory devices. Although only one integrated circuit device 14 and 16 is shown disposed on surfaces 10 and 12 respectively of substrate 8, there can be a plurality of such integrated circuit devices disposed on these surfaces. The electrical conductors within substrate 8 provide communication of electrical signals to the integrated circuit devices 14 and 16. These signals go through pads 28 through solder mounds 52 to pads 36, through electrical conductors in substrates 18, 20 or 22, through electrical interconnection means 80, 84 or 86 to electrical conductors on substrate 4. The electrical conductors on substrate 18, 20 and 22 also provide for power and ground distribution from substrate 4 to integrated circuit devices 14 and 16 on subassemblies 6 and 7.

In FIGS. 1 and 2, electronic device 14 can have pads 31 on surface 33 of device 14. Pad 31 can be bonded by wires 35 to pads 37 on surface 10 of substrate 8. Pad 57 can be in electrical connection with pads 28 through electrical conductors in substrate 8. Electronic device 16 can have pad 41 on surface 43 of device 16. Pad 41 can be bonded by wire 45 to pad 47 on surface 12 of substrate 8. Alternatively, as shown with respect to device 14' pad 31' on the surface 32' of the electronic device can be bonded by solder mound 35' to pad 37' on surface 10' of substrate 6. Electronic device 16' can have pad 41' on surface 43' of device 16'. Pad 41' can be bonded by solder mound 45' to pad 47' on surface 12' of substrate 6. Alternatively, electronic devices 14, 16, 14' and 16' can be bonded in a flip-chip-configuration with solder mounds electrically connected pads on the device surface to pads on the surfaces of substrates 6 and 8.

FIG. 3.1 is a top view of substrate 6 showing integrated circuit device 16' surrounded by contact pads 48 on which are disposed solder mounds 52 and vias 80 which provide electrical connection between surfaces 12' and 10' which are on the opposite side of substrate 6 or between electrical conductors on surface 12' or surface 10' to electrical conductors within substrate 6. Optional solder mounds 45' are also shown which provide electrical connection from integrated device 16' to substrate 20' FIG. 3.2 shows a top view of substrate 7.

Substrate 8 of subassemblies 6 and 7 is preferably a silicon wafer having electronic devices fabricated on opposite sides thereof.

FIGS. 4–9 show a process of fabricating a double sided silicon wafer by processing one side of the silicon wafer to form the integrated circuit device thereon and processing another in the same manner and laminating the two together. FIGS. 10–14 show an alternate method of fabricating structure 8 by the epitaxial growth of semiconductor material on a substrate with subsequent lamination onto a pretested power signal distribution substrate.

The structure of the present invention consists of preferably four or more levels of devices, with capacity for through vias. Between two double sided devices 6 and 7 there is a substrate 18 having on surfaces 34 and 36 a thin film distribution layer 18 which reroutes the interconnections from one side 34 of the package to the other side 36 of the package. This substrate 18 and additionally the optional substrates 20 and 22 on the outsides of the package carry both power to the electronic devices 16 and 14 I/O of the package. The preferred methods of how to manufacture double sided devices 6 and 7, will now be described.

Figure 4:
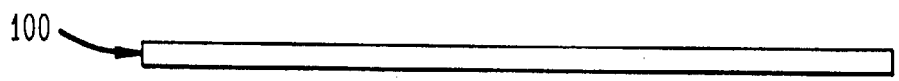
FIGS. 4–9 show a method of fabricating the subassemblies of the structure of FIG. 1.
Figure 5:
Figure 6:
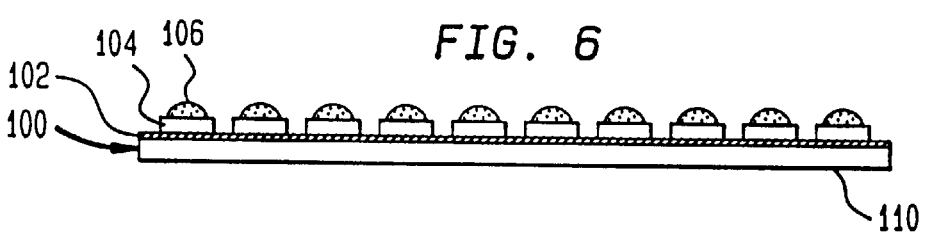
Figure 7:
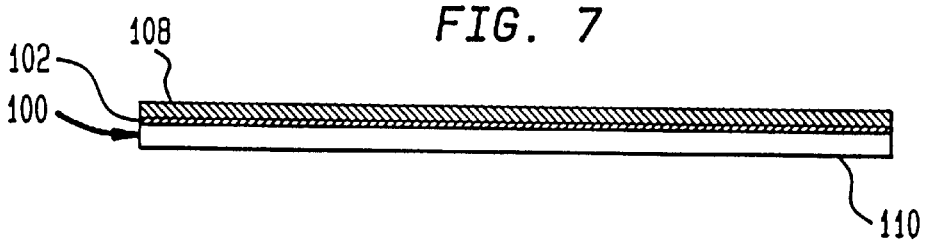

FIGS. 4–9 show one method of forming subassembly 6 or 7 of FIG. 1 or 2. FIG. 4 shows silicon wafer 100. On silicon wafer 100 there is disposed a multilevel semiconductor structure 102 having devices, such as, transistors, resistors, capacitors and metallization layers as commonly used to fabricate semiconductor devices. Contact pads 104 are deposited onto semiconductor structure 102. Solder mounds 106 commonly referred to a C4 solder balls, are disposed onto contact pads 104 by evaporation through metal masks or plate up as is common in the art. Alternatively, instead of using C4 balls surface mount structures can be fabricated as represented by region 108 of FIG. 7 which shows a land grid array. Surface 110 of wafer 104 which is opposite to the surface on which active device layer 102 is disposed is ground down or etched.

The silicon wafers can be ground to medium thickness's by conventional chem-etch polishing, as known in the art. The limitation on the final thickness of the wafer is the aspect of the through vias which can be formed in subsequent operations. For loose or current ground rule requirements, thin wafers can be obtained by first doping the silicon with boron. This provides a very uniform depth of boron atoms, which provides substantially greater solubility of the doped silicon compared with undoped silicon. This method provides minimal mechanical stress on the thinned wafer, thus preventing breakage and increasing the yield of product. Either of these processes can be performed at the wafer level or chip level.

Figure 8:
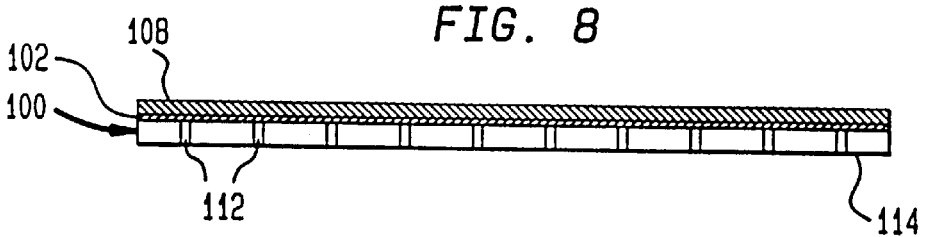

Subsequently, electrically conducting vias 102 as shown in FIG. 8 at surface 114 are formed by selective doping. Surface 114 is disposed onto surface 116 of substrate 118. Substrate 118 is preferably a metal core. the fabrication of which is shown in FIGS. 15–22 described below. On side 120 of substrate 118 there is disposed another structure such as the structure of FIG. 8 to form a double sided structure 6 as shown in FIGS. 1 and 2. The substrate 118 acts as an expansion matched power bus while also providing thermal management and isolated signal through holes. The core is prepatterned with a via grid matching that of the electrically conducting vias 112.

Figure 11:
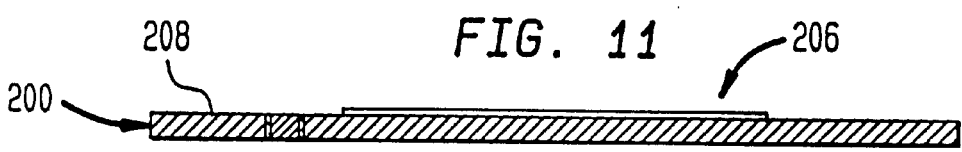
Figure 12:
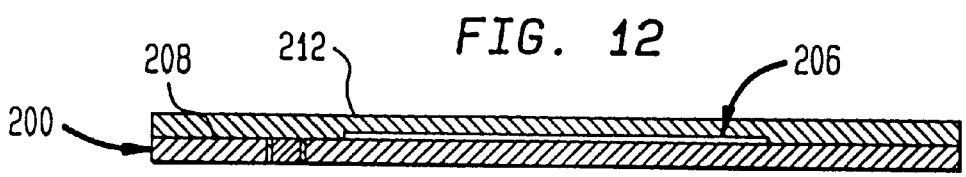
Figure 13:
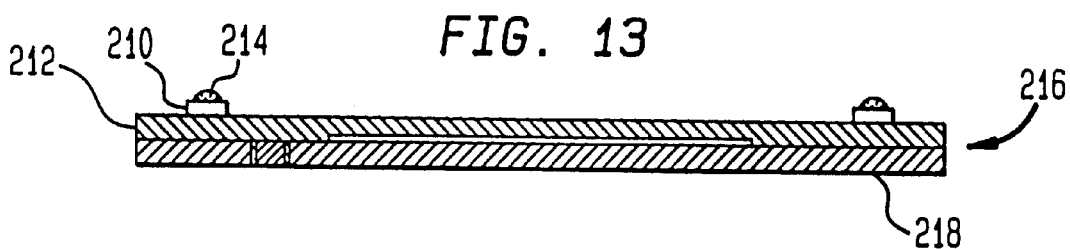
Figure 14:
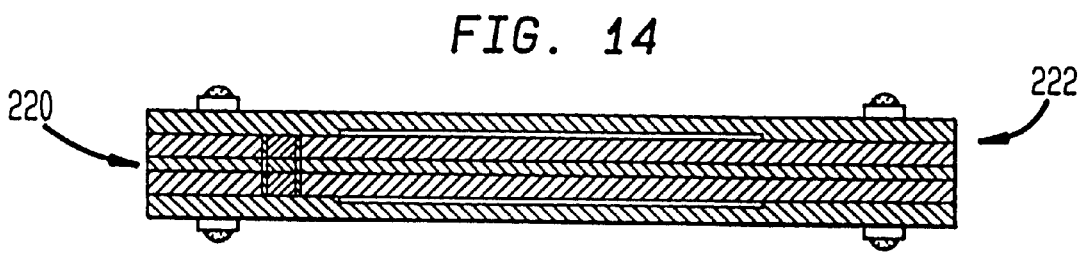

In FIGS. 10–14 a metal substrate 200, such as a molybdenum substrate has a plurality of electrically conducting through vias 202 formed therein surrounding the interior sidewall of through via 102 there is a dielectric material 204 such as a polyimide. As shown in FIG. 11, a layer of semiconducting material 206 such as silicon is grown by epitaxial methods known in the art onto surface 208 of substrate 200. As in conventional integrated circuit chips, electronic devices such as transistors, diodes, resistors and capacitors are fabricated in the semiconducting material layer 206. As shown in FIG. 12, metallization layers 208 are fabricated on semiconducting structure 206. Metallization 208 can be a multilevel dielectric/electrical conductor structure as is commonly used in the integrated circuit are, such as multilayer silicon dioxide/electrical conductor structures and multilayer polyimide electrical/conductor structures. As shown in FIG. 13, electrically conducting pads 210 are fabricated on surface 212 of multilayer structure 208. On pads 210 there are disposed solder mounds 214 or C4s. Two structures 216 as shown in FIG. 3 are disposed so that sides 218, which are opposite the side on which pads 210 are disposed, are placed adjacent each other with an adhesive layer 220 as shown in FIG. 14 there between to form structure 222 of FIG. 14 which is a double sided electronic device. Structure 222 of FIG. 14 can be used as subassembly 6 or 7 of FIGS. 1 and 2.

Figure 9:
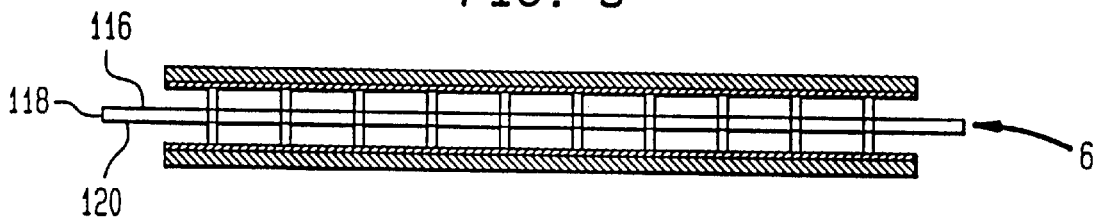
Figure 10:
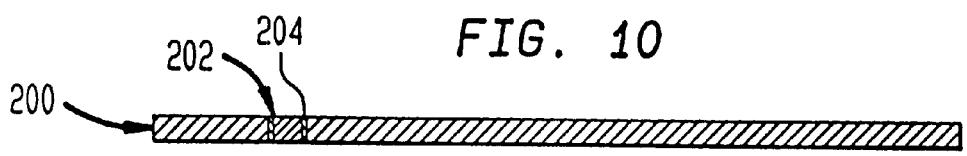
FIGS. 10–14 shows another method for fabricating the subassemblies for the structure of FIG. 1.

The metal cores, 118 in FIG. 9 and 220 in FIG. 14 can additionally act as multichip modules as an alternative to ceramic or silicon based modules. It can also act as part of a laminated power supply, in which the metal core acts as the primary means for distributing the power and limiting current and voltage drops due to resistance of the carrier and a thin film structure of circuit board structure laminated to this core provides the primary paths for signals to connect the electronic devices to each other and to external connections.

Figure 15:
FIGS. 15–22 show the method of fabricating a metal core card for use in the structure of FIGS. 1 and 2.
Figure 16:
Figure 17:
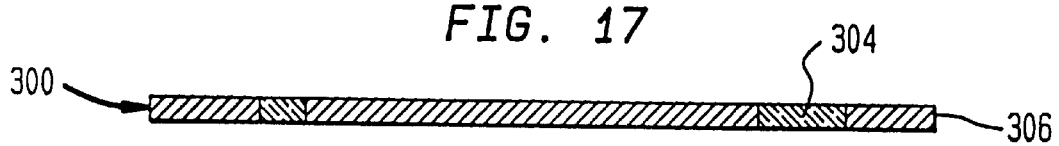

This carrier can be fabricated as shown in FIGS. 15–22. FIG. 15 shows a metal sheet 300, preferably molybdenum, with substantially planar surfaces. Holes 302 and 303 are produced in 300 using drill, if the ground rules permit it, such as for applications as multichip modules and laminated power supplies. When fine holes are required, patterned electroetching is the preferred method. Holes 302 and 303 are different sizes, depending on whether an insulated through via is to pass through at that position or a connected via. These holes are subsequently filled using a highly efficient filling polymer dielectric, 304, preferably a thermosetting type, such as an epoxy resin, cyanate ester resin, etc, which has the thermal properties suitable for the final application, to form structure 306. Furthermore, a dielectric such as polyimide or epoxy can be conformally coated using electrophoretic, electrodeposition, powder or spray coating.

Figure 18:
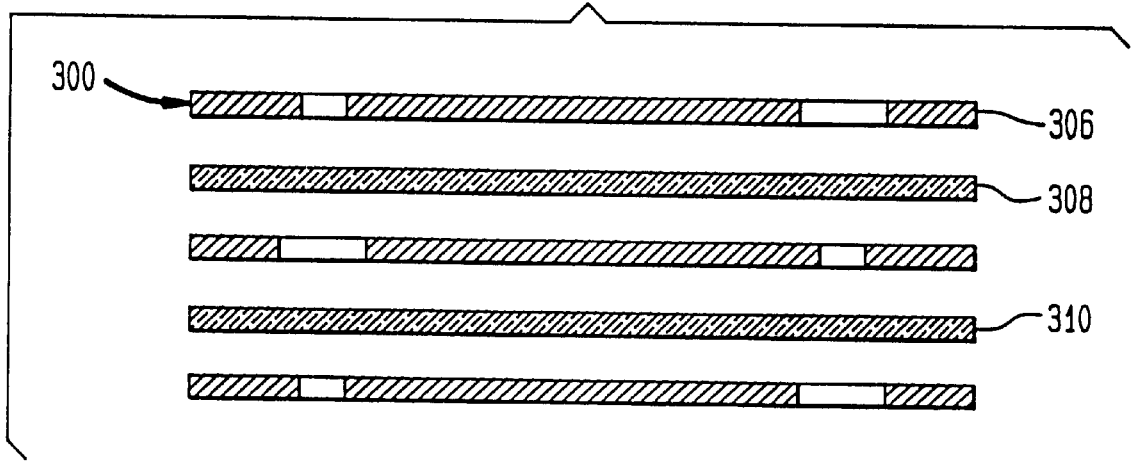
Figure 19:

A plurality of structures similar to 306 are stacked and laminated with alternating layers of a partially cured polymer dielectric, 308 and 310 in FIG. 18, which will ultimately act as an insulator to prevent electrical connection between the adjacent layers of metal. These polymer dielectric layers are preferably, but not necessarily the same composition as the dielectric 304 used to fill the holes in FIG. 17. Inorganic materials, such as ceramic green sheet can also be utilized at 308. The structures 306 are aligned as necessary to provide power and ground layers for the final structure. Holes are drilled in the structure to provide paths for electrical signals to pass, in some cases insulated from the metal layer being passed or in electrical contact.

Alternatively, holes can be formed in the polymer filler, 304, in positions which will ultimately be the positions for electrically connected vias. This can be accomplished by another drilling operation or through dry or wet etching as is commonly performed in the art. Similarly, holes are formed in in the interlayer dielectric material, 308 and 310 and the layers aligned, stacked and laminated similarly to that shown in FIG. 18. Alternatively, the holes in 308 and 310 are not formed until after lamination, using hole already formed in structure 306 as the mask. This eases alignment requirements.

Figure 20:
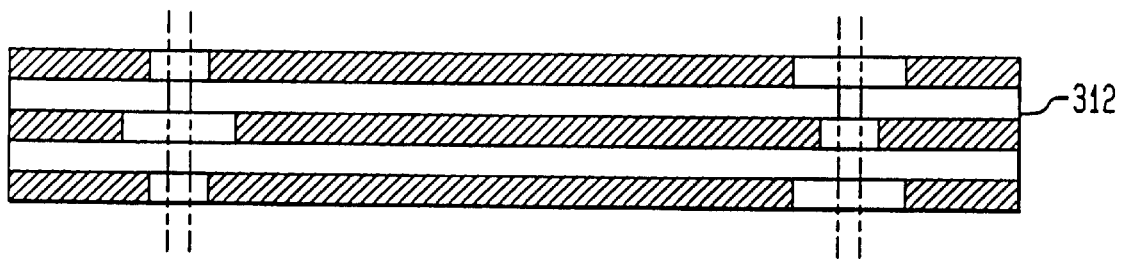
Figure 21:
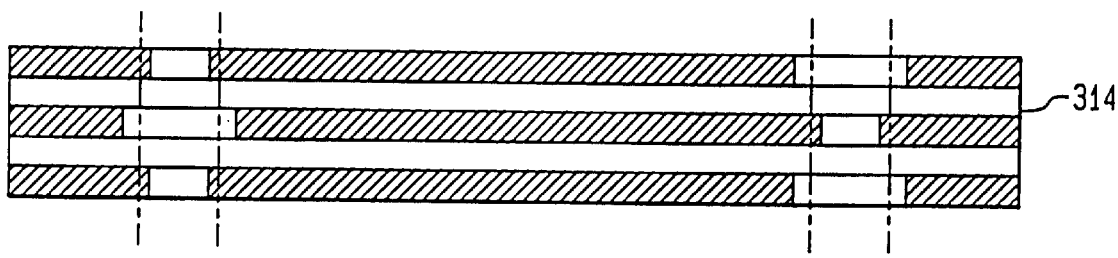
Figure 22:
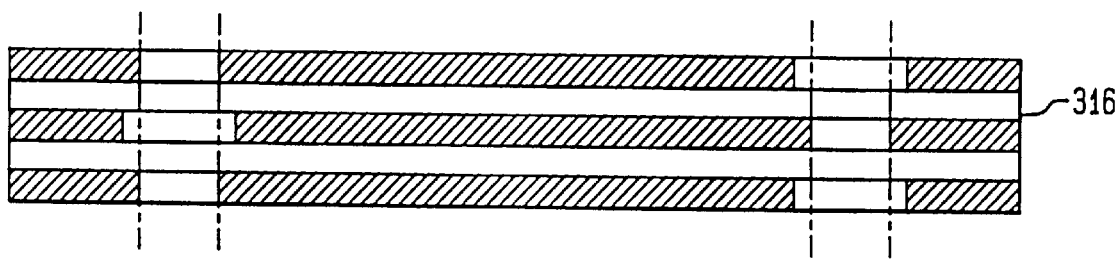

The laminated structure 312 in FIG. 20 is then exposed to a solution which preferentially etches the dielectric in a uniform manner to ensure that good electrical contact with the internal metal features can be obtained, to produce structure 314 in FIG. 21. The metal features are optionally etched to produce structure 316 in FIG. 22, which is suitable for plating of the through holes. This can be performed utilizing electroless processes known in the art, following the formation of a seed layer. Without the final metal etching, voids in the final plated through holes can be formed, which will impact reliability of the structure.

The final metal core structure can be used as a circuit board for direct mounting of chips or thin film redistribution layer. It can also function as a laminated power distribution structure and heat sink device for thermal management.

In summary, a three dimensional packaging architecture for an ultimate high performance computer has been described which allows the very dense packaging of multiple integrated circuit chips for minimum communication distances there between and maximum clock speeds. The structure is comprised of a plurality of subassemblies, each subassembly having at least one integrated circuit structure on both sides of a substrate which provides signal wiring between the integrated circuit devices within the substrate. Between adjacent subassemblies there is disposed a second substrate which provides power and ground distribution to the structure.

What is claimed is:

1. A method comprising:
   providing an electrically conductive plate of material having an array of through holes therein, each of which has a sidewall having a dielectric material disposed therein, said electrically conductive plate has a first side and a second side;
   disposing electrically conductive material in at least one of said through holes forming an electrically conductive via;
   growing a semiconducting layer on at least one of said first side and said second side, said semiconductor layer has an outer surface;
   forming electronic devices at said outer surface;
   forming electrically conductive paths in said semiconductor layer to provide electrical connection to said electrically conductive via.

2. A method as in claim 1, further including forming on said outer surface an electrically conductive pattern for electrically interconnecting said devices.

3. A method as in claim 1, further including disposing said second side of said electrically conductive plate in contact with a second side of another electrically conductive plate of material.

4. A method as in claim 2, further including disposing said second side of said electrically conductive plate in contact with a second side of another electrically conductive plate of material.

5. A method according to claim 1 wherein said semiconductor layer is grown epitaxially on said at least one of said first and said second sides of said electrically conductive plate.

6. A method according to claim 1 wherein said electrically conductive plate is formed from a metal.

7. A method according to claim 3 or 4 wherein said method forms a structure having a first semiconductor layer on said first side of said electrically conductive plate and said second side of said electrically conductive plate, further including disposing said structure between a first and second electrical component providing electrical interconnection there between.

8. A method according to claim 3, further including disposing a dielectric layer between said plate of electrically conductive material and said another plate of electrically conductive material.

9. A method comprising:
   providing an electrically conductive plate of material having an array of through holes therein each of which has a sidewall having a dielectric material disposed therein, said electrically conductive plate has a first side and a second side;
   forming on said outer surface an electrically conductive pattern for electrically interconnecting said devices;
   disposing electrically conductive material in at least one of said through holes forming an electrically conductive via;
   epitaxially growing a semiconducting layer on at least one of said first side and said second side, said semiconductor layer has an outer surface;
   forming electronic devices at said outer surface;
   forming electrically conductive paths is said semiconductor layer to provide electrical connection to said electrically conductive via;
   disposing said second side of said electrically conductive plate in contact with a second side of another electrically conductive plate of material to form a structure;
   disposing said structure between a first and second electrical component providing electrical interconnection there between.

10. A method comprising the steps of:
    providing a first semiconductor wafer having a first and second side, said first semiconductor wafer has devices at said first side thereof;
    forming electrically conducting vias extending from said second side providing electrical connection to said devices at said first side;
    providing an electrically conductive plate having a first side and a second side;
    providing a second semiconductor wafer having a first side and a second side, said second semiconductor wafer has devices at said first side thereof;
    disposing said second side of said first semiconductor wafer in contact with said first side of said electrically conductive plate;
    disposing said second side of said second semiconductor wafer as said second side of said electrically conductive plate.

11. A method as in claim 10, further including forming on said outer surface an electrically conductive pattern for electrically interconnecting said devices.

12. A method according to claim 10, further including disposing said second side of said electrically conductive plate in contact with a second side of another electrically conductive plate of material.

13. A method as in claim 11, further including disposing said second side of said electrically conductive plate in contact with a second side of another electrically conductive plate of material.

14. A method according to claim 10, wherein said semiconductor layer is grown epitaxially on said at least one of said first and said second side of said electrically conductive plate.

15. A method according to claim 10, wherein said electrically conductive plate is formed from a metal.

16. A method according to claim 12 or 13 wherein said method forms a structure having a first semiconductor layer on said first side of said electrically conductive plate and said second side of said electrically conductive plate, further including disposing said structure between a first and second electrical component providing electrical component providing electrical interconnection there between.

17. A method according to claim 16, further including disposing a dielectric layer between said plate of electrically conductive material and said another plate of electrically conductive material.

18. A method comprising the steps of:
- providing a first semiconductor wafer having a first and second side, said first semiconductor wafer has devices at said first side thereof;
- forming electrically conductive plate having a first side and a second side;
- providing a second semiconductor wafer having a first side and a second side, said second semiconductor wafer has devices at said first side thereof;
- disposing said second side of said first semiconductor wafer on said first side of said electrically conductive plate;
- disposing said second side of said second semiconductor wafer on said second side of said electrically conductive plate;
- forming on said outer surface an electrically conductive pattern for electrically interconnecting said devices;
- disposing said second side of said electrically conductive plate in contact with a second side of another electrically conductive plate of material, with a dielectric layer therebetween;
- disposing an epitaxially grown semiconductor layer on said first and said second sides of said electrically conductive plate.

19. A method comprising:
- forming a plurality of plates of electrically conductive material, said plates having through holes filled with dielectric material by the method comprising:
  - providing an electrically conductive sheet of material;
  - forming in said electrically conductive sheet a plurality of through holes,
  - disposing is said plurality of through holes a dielectric material,
- disposing a sheet of dielectric material between a first plate having a first through hole of said plurality of electrically conductive plates and a second plate having a second through hole of said plurality of electrically conductive plates, so that said first through hole is disposed in alignment with said second through hole forming a combined through hole;
- said first through hole has a first sidewall;
- said second through hole has a second sidewall;
- said first through hole has a larger cross sectional area than said second through hole;
- forming an opening in said dielectric material in said combined through hole, so that said second sidewall is exposed and said first sidewall has a dielectric coating thereon;
- filling said opening with an electrically conductive material.

* * * * *